: (12) United States Patent
Kim et al.

(10) Patent No.: US 11,374,150 B2
(45) Date of Patent: Jun. 28, 2022

(54) DISPLAY DEVICE AND METHOD FOR SELF-ASSEMBLING SEMICONDUCTOR LIGHT EMITTING DIODES

(71) Applicant: LG ELECTRONICS INC., Seoul (KR)

(72) Inventors: Junghoon Kim, Seoul (KR); Hyunwoo Cho, Seoul (KR); Mihee Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/858,167

(22) Filed: Apr. 24, 2020

(65) Prior Publication Data

US 2020/0403118 A1    Dec. 24, 2020

(30) Foreign Application Priority Data

Jun. 20, 2019   (KR) .......................... 10-2019-0073654

(51) Int. Cl.
*H01L 33/00* (2010.01)
*H01L 25/075* (2006.01)
*H01L 33/62* (2010.01)

(52) U.S. Cl.
CPC ...... *H01L 33/0095* (2013.01); *H01L 25/0753* (2013.01); *H01L 33/62* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| 9,825,202 | B2 | 11/2017 | Schuele et al. | |
| 2010/0276638 | A1* | 11/2010 | Liu | B82Y 30/00 |
| | | | | 252/301.35 |
| 2014/0361409 | A1 | 12/2014 | Rogers et al. | |
| 2021/0202800 | A1* | 7/2021 | Jung | B82B 3/0052 |

FOREIGN PATENT DOCUMENTS

| KR | 10-2013-0093528 A | 8/2013 |
| KR | 10-2016-0098431 A | 8/2016 |
| KR | 10-2018-0030454 A | 3/2018 |
| KR | 10-2018-0070506 A | 6/2018 |
| KR | 10-2020-0026679 A | 3/2020 |

* cited by examiner

*Primary Examiner* — Ratisha Mehta
(74) *Attorney, Agent, or Firm* — Birch, Stewart, Kolasch & Birch, LLP

(57) ABSTRACT

A display device can include a plurality of semiconductor light emitting diodes; first and second wiring electrodes respectively extending from the plurality of semiconductor light emitting diodes to supply an electrical signal to the plurality of semiconductor light emitting diodes; a plurality of pair electrodes disposed on a substrate and having a first electrode and a second electrode that generate an electric field when a current is supplied thereto; a dielectric layer disposed to cover the plurality of pair electrodes; and a covalent bond layer disposed between the dielectric layer and the plurality of semiconductor light emitting diodes, and forming a covalent bond with the dielectric layer and each of the plurality of semiconductor light emitting diodes, wherein the first wiring electrode and the second wiring electrode are located at opposite sides of the plurality of pair electrodes based on the plurality of semiconductor light emitting diodes.

20 Claims, 14 Drawing Sheets

DISPLAY DEVICE AND METHOD FOR SELF-ASSEMBLING SEMICONDUCTOR LIGHT EMITTING DIODES

CROSS-REFERENCE TO RELATED APPLICATION

Pursuant to 35 U.S.C. § 119(a), this application claims the benefit of the earlier filing date and the right of priority to Korean Patent Application No. 10-2019-0073654, filed in the Republic of Korea on Jun. 20, 2019, the entire contents of which is hereby expressly incorporated by reference into the present application.

BACKGROUND

1. Technical Field

The present disclosure relates to a display device and a method of self-assembling semiconductor light emitting diodes for manufacturing the display device, and one particular implementation relates to a display device using semiconductor light emitting diodes having sizes of several μm to several tens of μm and a method of manufacturing the same.

2. Description of the Related Art

In recent years, in the field of display technology, liquid-crystal displays (LCD), organic light-emitting diode (OLED) displays, microLED displays, etc. have been competing to realize large-area displays.

Meanwhile, semiconductor microLEDs (μLED) with a diameter or cross-sectional area less than 100 microns, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes a new manufacturing method and device for self-assembling microLEDs.

SUMMARY OF THE INVENTION

One aspect of the present disclosure is to provide a new manufacturing process that provides high reliability in large-screen displays using micro-size semiconductor light-emitting diodes.

Another aspect of the present disclosure is to provide a manufacturing process, capable of improving transfer accuracy when self-assembling semiconductor light-emitting diodes onto an assembly substrate.

Still another aspect of the present disclosure is to provide a structure, which can prevent semiconductor light emitting diodes from being separated from a substrate after the semiconductor light emitting diodes are self-assembled, and a method for manufacturing the same.

To achieve these and other advantages and in accordance with the purpose of this specification, as embodied and broadly described herein, there is provided a display device, including a plurality of semiconductor light emitting diodes, first and second wiring electrodes respectively extending from the semiconductor light emitting diodes to supply an electrical signal to the semiconductor light emitting diodes, a plurality of pair electrodes disposed on a substrate and having a first electrode and a second electrode that generate an electric field when a current is supplied, and a dielectric layer disposed to cover the pair electrodes. The first wiring electrode and the second wiring electrode can be located at an opposite side of the plurality of pair electrodes based on the semiconductor light emitting diodes. The display device can further include a covalent bond layer disposed between the dielectric layer and the semiconductor light emitting diodes and forming a covalent bond with the dielectric layer and each of the semiconductor light emitting diodes.

In one embodiment, an Si—O bond can be formed between the dielectric layer and the covalent bond layer.

In one embodiment, any one of an ester bond and an amide bond can be formed between the semiconductor light emitting diode and the covalent bond layer.

In one embodiment, the covalent bond layer can be a reaction product between a functional group formed on a surface of the substrate and a surface of each of the semiconductor light emitting diodes and a compound according to the following chemical formula 3, or a reaction product between the functional group formed on the surface of the substrate and the surface of each of the semiconductor light emitting diodes and a mixture of the compound according to the following chemical formula 3 and a compound according to the following chemical formula 4,

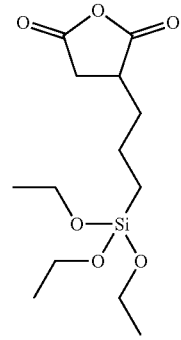

[Chemical Formula 3]

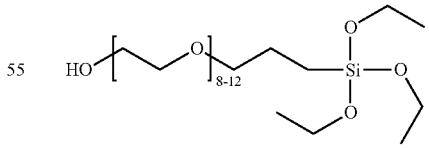

[Chemical Formula 4]

A method for self-assembling semiconductor light emitting diodes according to the present disclosure can include forming predetermined functional groups on surfaces of a plurality of semiconductor light emitting diodes each including a magnetic material, through surface treatment, bonding a predetermined compound to a surface of a substrate having a plurality of assembly electrodes, transferring the substrate to an assembly position and introducing the semiconductor light emitting diodes into a fluid chamber, applying magnetic force to the semiconductor light-emitting diodes so that the semiconductor light-emitting diodes move in one direction within the fluid chamber, inducing the semiconductor light emitting diodes to a preset position by applying a voltage to the plurality of assembly electrodes disposed on the substrate, such that the semiconductor light emitting diodes are seated at the preset position during the movement, and performing heat treatment for the substrate such that a covalent bond is formed through a reaction between the predetermined functional groups and the predetermined compound bonded to the surface of the substrate.

In one embodiment, the applying of the magnetic force to the semiconductor light emitting diodes and the inducing of the semiconductor light emitting diodes to the preset position can be performed at least once in a state where semiconductor light emitting diodes emitting a first color are introduced into the fluid chamber, and at least once in a state where semiconductor light emitting diodes emitting a second color different from the first color are introduced in the fluid chamber.

In one embodiment, the inducing of the semiconductor light emitting diodes emitting the first color to the preset position can be performed by applying a voltage to a part of the plurality of assembly electrodes so that the semiconductor light emitting diodes emitting the first color are induced to a preset first position, the inducing of the semiconductor light emitting diodes emitting the second color to the preset position can be performed by applying a voltage to another part of the plurality of assembly electrodes so that the semiconductor light emitting diodes emitting the second color are induced to a preset second position.

In one embodiment, the performing of the heat treatment of the substrate can be performed at least once in the state where the semiconductor light emitting diodes emitting the first color are seated at the preset first position, and at least once in the state where the semiconductor light emitting diodes emitting the second color are seated at the preset second position.

The method can further include blocking a voltage applied to a part of the plurality of assembly electrodes when the semiconductor light emitting diodes emitting the second color are induced to the preset second position after the semiconductor light emitting diodes emitting the first color are seated in the preset first position.

In one embodiment, the preset compound can be a compound according to the following chemical formula 3, or a mixture of a compound according to the following chemical formula 3 and a compound according to the following chemical formula 4,

[Chemical Formula 3]

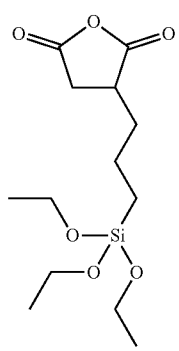

[Chemical Formula 4]

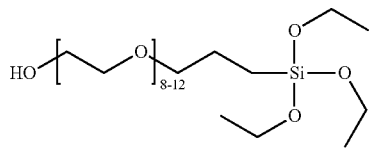

With the above configuration according to the present disclosure, many semiconductor light-emitting diodes can be assembled at a time on a display device where individual pixels are made up of microLEDs.

As such, according to the present disclosure, a large number of semiconductor light-emitting diodes can be pixelated on a small-sized wafer and then transferred onto a large-area substrate. This enables the manufacture of a large-area display device at a low cost.

Moreover, according to the manufacturing method of the present disclosure, a low-cost, high-efficiency, and quick transfer of semiconductor light-emitting diodes can be done, regardless of the sizes or numbers of parts and the transfer area, by simultaneously transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

According to the present disclosure, in the case of sequentially self-assembling different types of semiconductor light emitting diodes, when semiconductor light emitting diodes of another type are self-assembled after semiconductor light emitting diodes of one type are self-assembled, a voltage applied to the assembly electrodes corresponding to the one type of semiconductor light emitting diodes can be blocked by use of the covalent bond layer. Accordingly, the present disclosure can prevent the semiconductor light emitting diodes of the another type from being aligned at a position where the semiconductor light emitting diodes of the one type should be aligned, in the case where such different types of semiconductor light emitting diodes are sequentially self-assembled.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements can also be present.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head mounted display (HMD), a desktop computer, and the like. However, it will be readily apparent to those skilled in the art that the configuration according to the embodiments described herein can also be applied to a new product type that will be developed later if the device is a device capable of emitting light.

Figure 1:
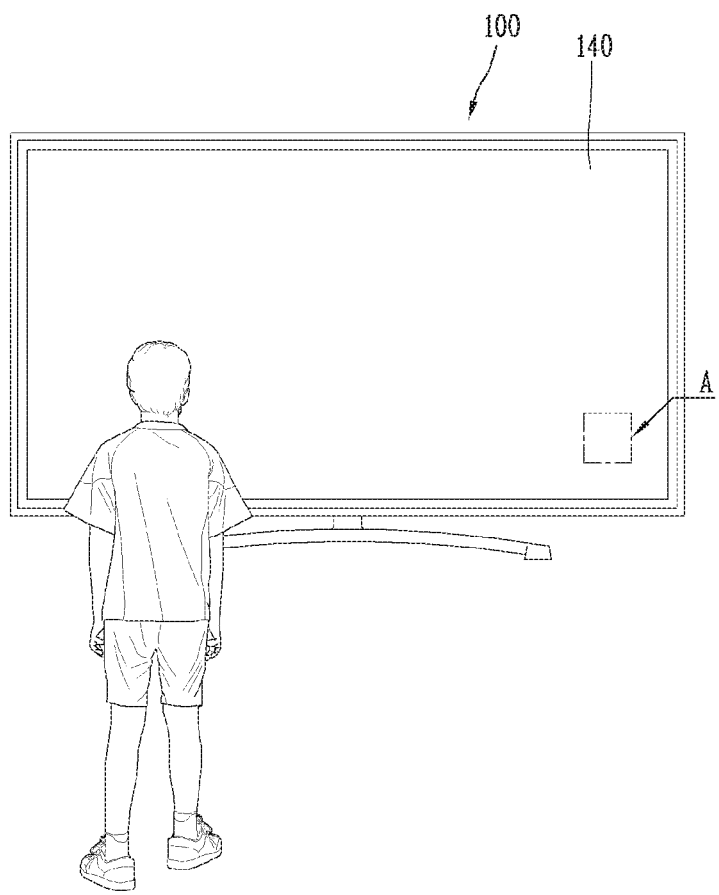
FIG. 1 is a conceptual view illustrating one embodiment of a display device using a semiconductor light emitting diode according to the present disclosure.
Figure 2:
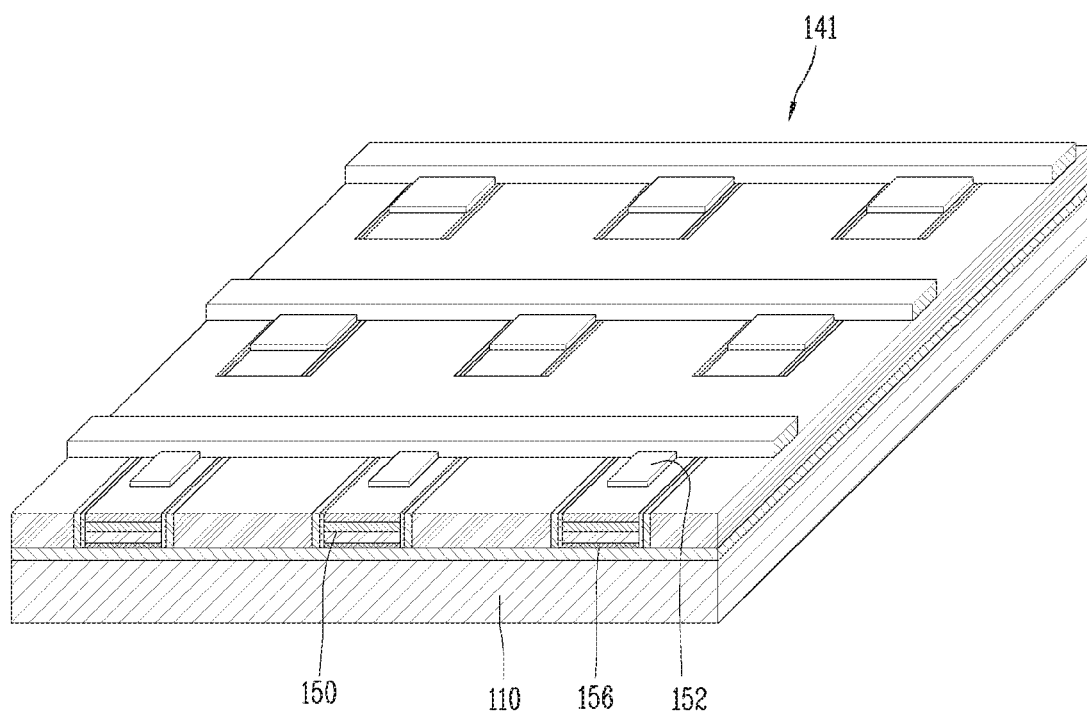
FIG. 2 is a partial enlarged view of the portion A in the display device of FIG. 1.
Figure 3:
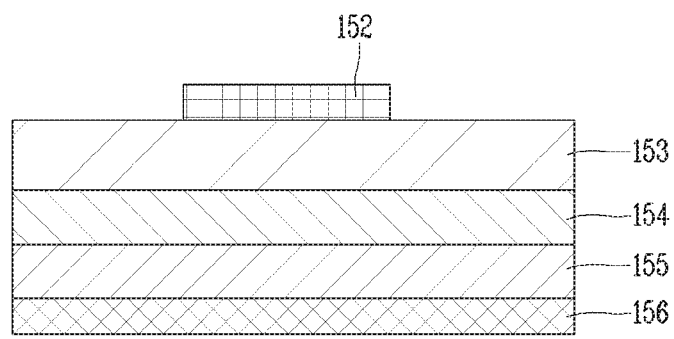
FIG. 3 is an enlarged view of the semiconductor light-emitting diodes of FIG. 2.
Figure 4:
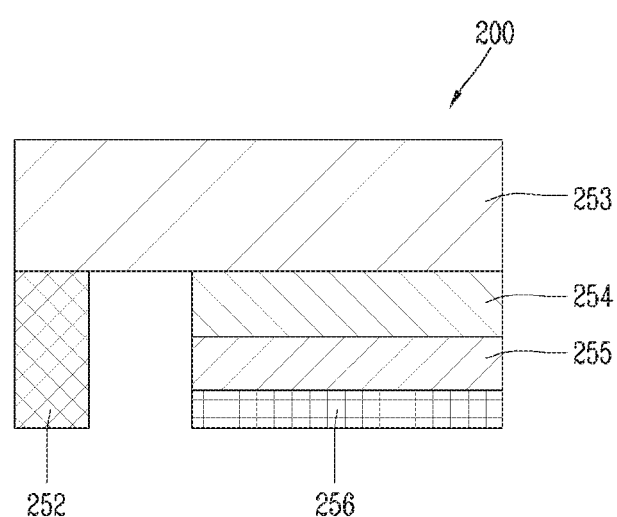
FIG. 4 is an enlarged view illustrating another embodiment of the semiconductor light-emitting diodes of FIG. 2.

FIG. 1 is a conceptual diagram illustrating one embodiment of a display device using semiconductor light-emitting diodes according to the present disclosure, FIG. 2 is a partial enlarged view of the portion A in the display device of FIG. 1, FIG. 3 is an enlarged view of the semiconductor light-emitting diodes of FIG. 2, and FIG. 4 is an enlarged view illustrating another embodiment of the semiconductor light-emitting diodes of FIG. 2. All elements of the display device are operationally coupled and configured.

According to the illustration, information processed by a controller of a display device 100 can be output by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines or wiring electrodes including first and second wiring electrodes, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs can be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixel can contain at least three microLEDs.

More specifically, referring to FIG. 3, the semiconductor light-emitting diode 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type semiconductor layer 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. The electrodes can be disposed in the upward/downward direction in the vertical semiconductor light-emitting diode 150, thereby providing a great advantage capable of reducing the chip size.

In another example, referring to FIG. 4, the semiconductor light-emitting diodes can be flip chip-type light-emitting diodes.

As an example of such a flip chip-type light-emitting diode, the semiconductor light-emitting diode 250 comprises a p-type electrode 256, a p-type semiconductor layer 255 formed on the p-type semiconductor layer 256, an active layer 254 formed on the p-type semiconductor layer 255, an n-type semiconductor layer 253 formed on the active layer 254, and an n-type electrode 252 vertically separated from the p-type electrode 256, on the n-type semiconductor layer 253. In this case, both the p-type electrode 256 and the n-type electrode 252 can be electrically connected to a p electrode and n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN. However, for the red semiconductor light-emitting diodes, the p-type semiconductor layer can be P-type GaAs, and the n-type semiconductor layer can be N-type GaAs.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-explained display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can solve these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes. Also, although the illustration will be given of how horizontal semiconductor light-emitting diodes are self-assembled, it can also apply to self-assembling of vertical semiconductor light-emitting diodes.

Figure 5A:
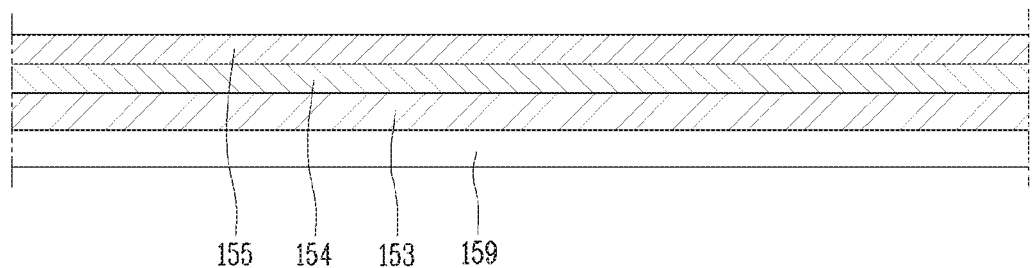
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this exemplary embodiment is illustrated by assuming the presence of the active layer, the active layer can be omitted if necessary, as stated above. In an example, the p-type semiconductor layer can be P-type GaN doped with Mg, and the n-type semiconductor layer can be N-type GaN doped with Si on the n electrode.

The growth substrate 159 (wafer) can be formed of, but not limited to, light-transmissive material—for example, at least one among sapphire (Al2O3), GaN, ZnO, and AlO. Also, the growth substrate 159 can be made from a material suitable for growing semiconductor materials or carrier wafer. The growth substrate 159 can be formed of a high thermal conducting material, and can be a conductive substrate or insulating substrate—for example, at least one among SiC, Si, GaAs, GaP, InP, and Ga2O3 substrates which have higher thermal conductivity than sapphire (Al2O3) substrates.

Figure 5B:
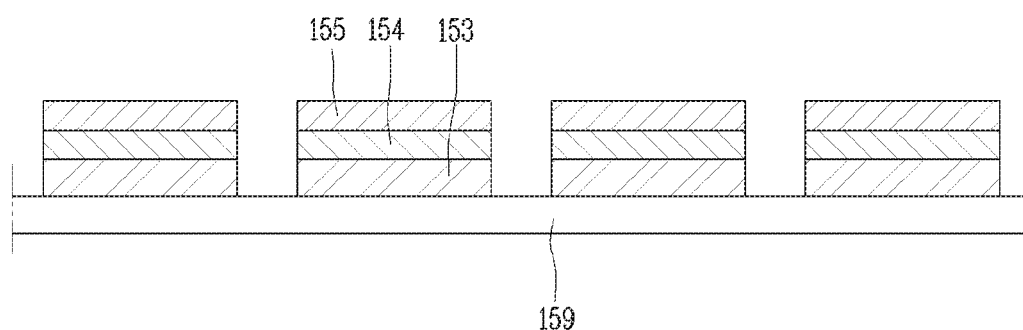

Next, a plurality of semiconductor light-emitting diodes is formed by removing at least part of the first conductive semiconductor layer 153, active layer 154, and second conductive semiconductor layer 155 (FIG. 5B).

More specifically, isolation is performed so that the light-emitting diodes form a light-emitting diode array. That is, a plurality of semiconductor light-emitting diodes is formed by vertically etching the first conductive semiconductor layer 153, active layer 154, and second conductive semiconductor layer 155.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Figure 5C:
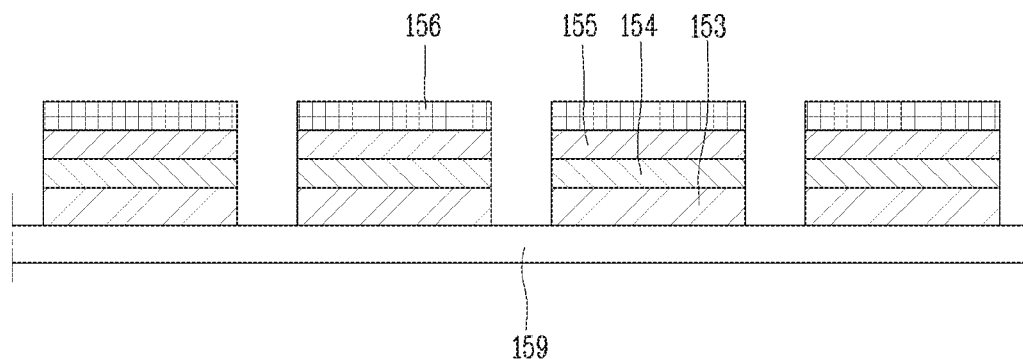

Next, a second conductive electrode 156 (or p-type electrode) is formed on one surface of the second conductive semiconductor layer 155 (FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Figure 5D:
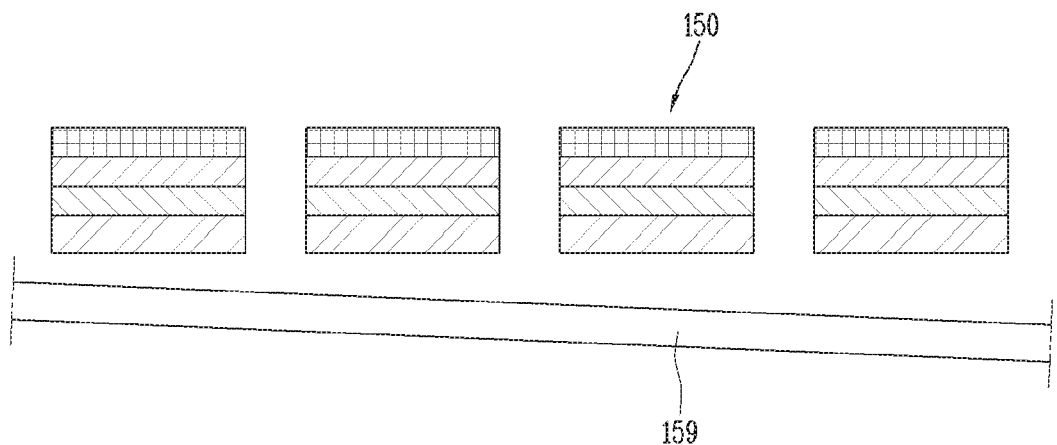

Next, the growth substrate 159 is removed, thus leaving a plurality of semiconductor light-emitting diodes. For example, the growth substrate 159 can be removed using laser lift-off (LLO) or chemical lift-off (CLO) (FIG. 5D).

Figure 5E:
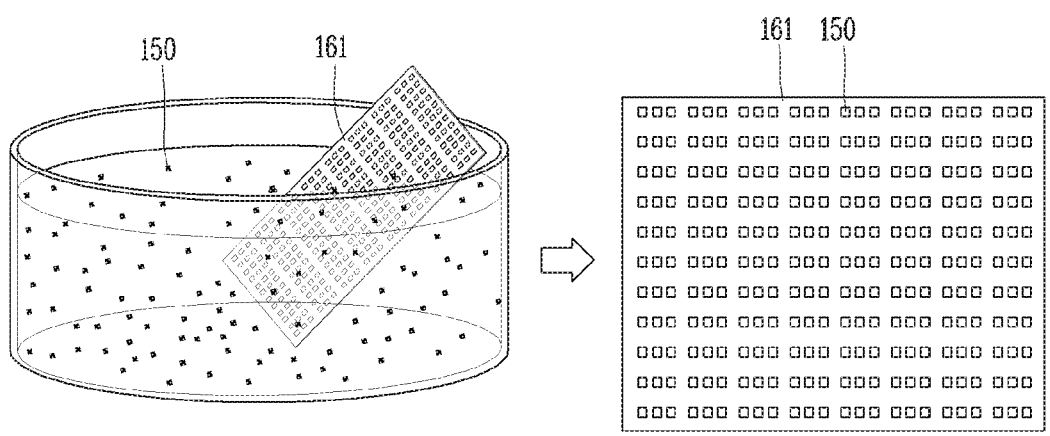

Afterwards, the step of mounting the semiconductor light-emitting didoes 150 on a substrate in a chamber filled with a fluid is performed (FIG. 5E).

For example, the semiconductor light-emitting diodes 150 and the substrate are put into the chamber filled with a fluid, and the semiconductor light-emitting diodes are self-assembled onto the substrate 1061 using fluidity, gravity, surface tension, etc. In this case, the substrate can be an assembly substrate 161.

In another example, a wiring substrate, instead of the assembly substrate 161, can be put into a fluid chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
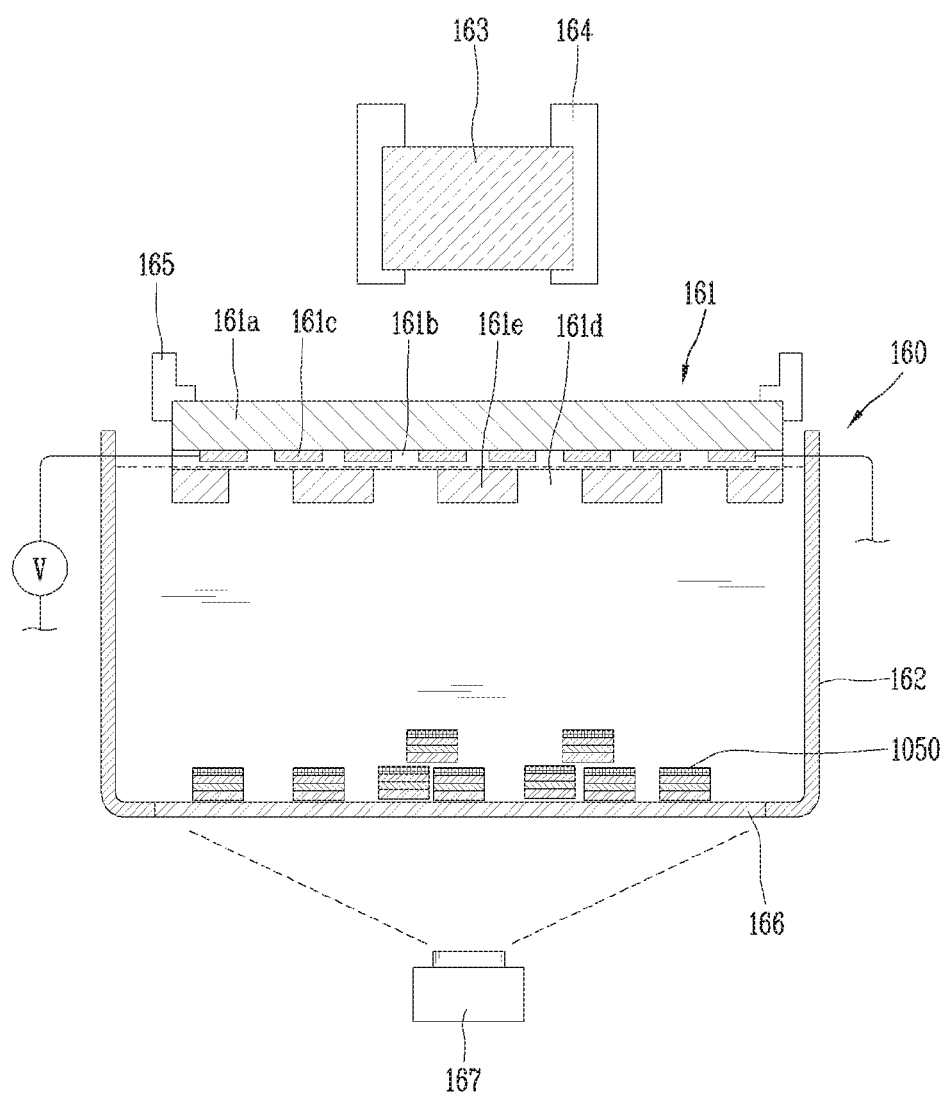
FIG. 6 is a conceptual diagram illustrating an example of a device for self-assembling semiconductor light-emitting diodes according to the present disclosure.
Figure 7:
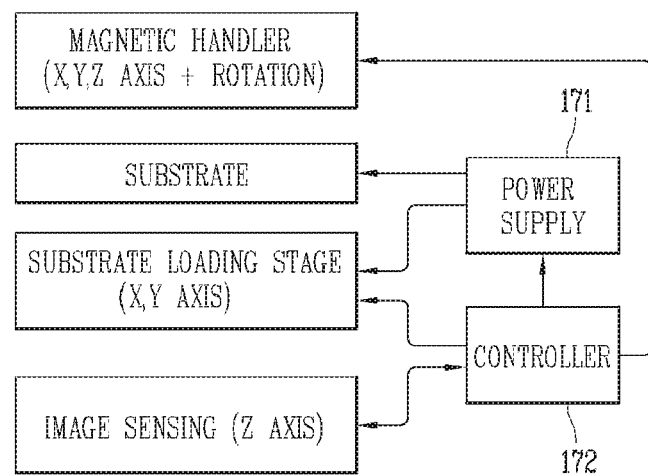
FIG. 7 is a block diagram of the self-assembly device of FIG. 6.

FIG. 6 is a conceptual diagram showing an example of a device for self-assembling semiconductor light-emitting diodes according to the present disclosure, and FIG. 7 is a block diagram of the self-assembly device of FIG. 6. FIGS. 8A to 8D are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8D. All elements of the device for self-assembling semiconductor light-emitting diodes according to the present disclosure are operationally coupled and configured.

Referring to FIGS. 6 and 7, the self-assembly device 160 of the present disclosure can comprise a fluid chamber 162, magnets 163, and a position controller 164.

The fluid chamber 162 is equipped with space for a plurality of semiconductor light-emitting diodes. The space can be filled with a fluid, and the fluid can be an assembly solution, which includes water or the like. Thus, the fluid chamber 162 can be a water tank and configured as open-type. However, the present disclosure is not limited to this, and the fluid chamber 162 can be a closed-type chamber that comes with a closed space.

A substrate 161 can be placed in the fluid chamber 162 so that an assembly surface where the semiconductor light-emitting diodes 150 are assembled faces downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the fluid chamber 162. As shown in the drawings, the assembly surface of the substrate 161 is placed in such a way as to be soaked with the fluid in the fluid chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, $SiN_x$, $SiON$, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by barrier walls 161e. The cells 161d can be sequentially arranged in one direction and made of polymer material. Also, the barrier walls 161e forming the cells 161d can be shared with neighboring cells 161d. The barrier walls 161e can protrude from the base portion 161a, and the cells 161d can be sequentially arranged in one direction along the barrier walls 161e. More specifically, the cells 161d can be sequentially arranged in column and row directions and have a matrix structure.

As shown in the drawings, the cells 161d can have recesses for containing the semiconductor light-emitting diodes 150, and the recesses can be spaces defined by the barrier walls 161e. The recesses can have a shape identical or similar to the shape of the semiconductor light-emitting diodes. For example, if the semiconductor light-emitting diodes are rectangular, the recesses can be rectangular too. Moreover, the recesses formed in the cells can be circular if the semiconductor light-emitting diodes are circular. Further, each cell is configured to contain one semiconductor light-emitting diode. That is, one cell contains one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have magnets 163 for applying magnetic force to the semiconductor light-emitting diodes. The magnets 163 are placed at a distance from the fluid chamber 162 and apply a magnetic force to the semiconductor light-emitting diodes 150. The magnets 163 can be placed to face the opposite side of the assembly surface of the substrate 161, and the positions of the magnets 163 are controlled by the position controller 164 connected to the magnets 163.

The semiconductor light-emitting diodes 1050 can have a magnetic material so that they are moved within the fluid by a magnetic field.

Referring to FIG. 9, a semiconductor light-emitting diode having a magnetic material can comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1052 and where the second conductive layer 1056 is placed, and an active layer 1054 placed between the first and second conductive semiconductor layers 1053 and 1055.

Here, the first conductive can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the fluid chamber of the self-assembly device, a magnet handler capable of automatically or manually moving the magnets 163 on the x, y, and z axes or a motor capable of rotating the magnets 163 can be provided. The magnet handler and motor can constitute the position controller 164. As such, the magnets 163 can rotate in a horizontal, clockwise, or counterclockwise direction to the substrate 161.

Meanwhile, the fluid chamber 162 can be formed with a light-transmissive bottom plate 166, and the semiconductor light-emitting diodes can be placed between the bottom plate 166 and the substrate 161. An image sensor 167 can be placed opposite the bottom plate 166 so as to monitor the inside of the fluid chamber 162 through the bottom plate 166. The image sensor 167 can be controlled by a controller 172, and can come with an inverted-type lens, CCD, etc. so as to observe the assembly surface of the substrate 161.

The above-explained self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-explained self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Figure 8A:
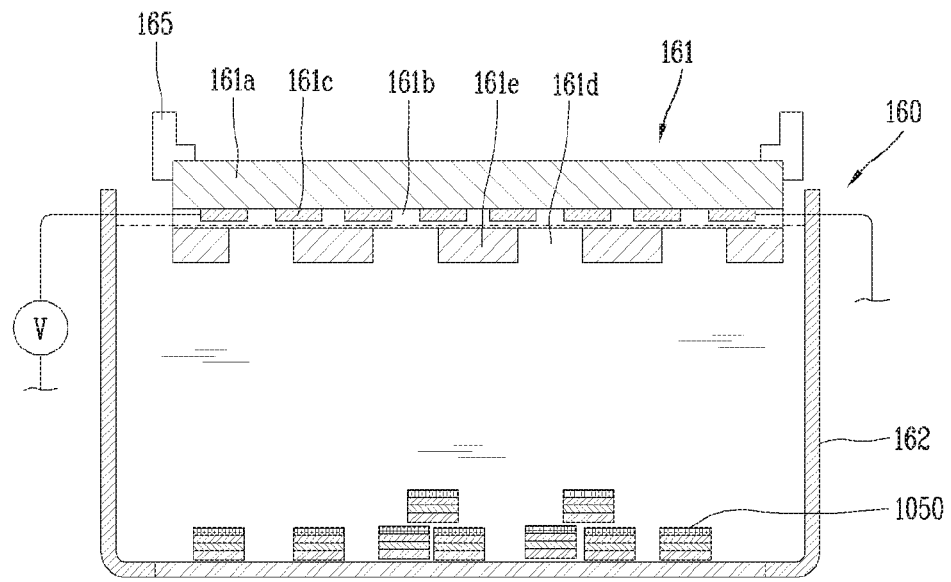
FIGS. 8A to 8E are conceptual diagrams illustrating a process for self-assembling semiconductor light-emitting diodes using the self-assembly device of FIG. 6.
Figure 9:
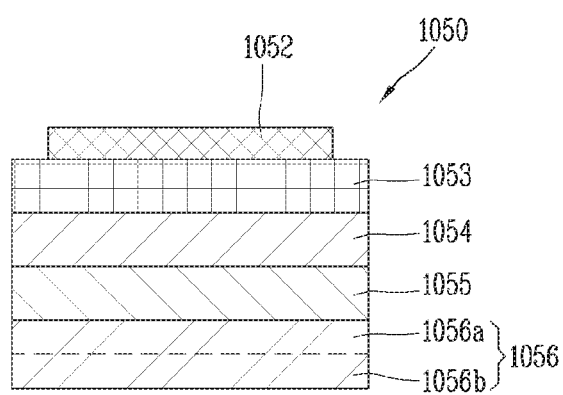
FIG. 9 is a conceptual diagram illustrating the semiconductor light-emitting diodes of FIGS. 8A to 8E.

Next, the substrate 161 is fed to an assembly site, and the semiconductor light-emitting diodes 1050 are put into the fluid chamber 162 (FIG. 8A).

As described above, the assembly site on the substrate 161 can be a position at which the substrate 161 is placed in the fluid chamber 162 in such a way that an assembly surface where the semiconductor light-emitting diodes 150 are assembled faces downwards.

In this case, some of the semiconductor light-emitting diodes 1050 can sink to the bottom of the fluid chamber 162 and some of them can float in the fluid. If the fluid chamber 162 comes with a light-transmissive bottom plate 166, some of the semiconductor light-emitting diodes 1050 can sink to the bottom plate 166.

Figure 8B:
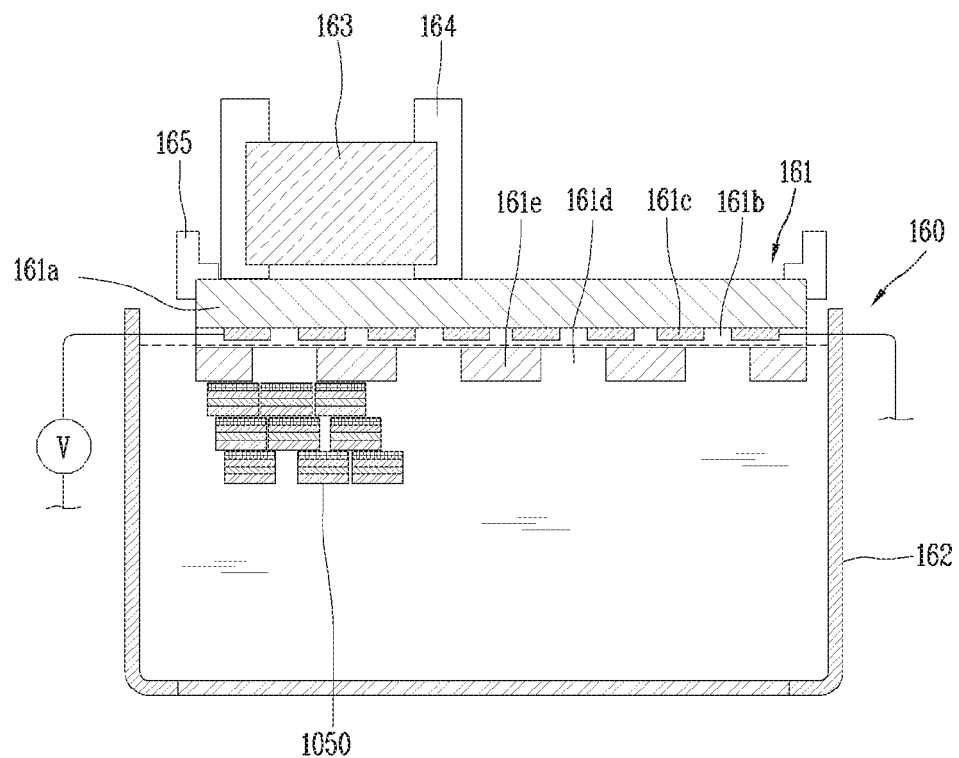

Next, a magnetic force is applied to the semiconductor light-emitting diodes 1050 so that the semiconductor light-emitting diodes 1050 in the fluid chamber 162 come up to the surface (FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions can refer to positions at which the magnets 163 are outside the fluid chamber 162. In another example, the magnets 163 can be composed of electromagnets. In this case, an initial magnetic force is generated by supplying electricity to the electromagnets.

Meanwhile, in this embodiment, the spacing between the assembly surface of the substrate 161 and the semiconductor light-emitting diodes 1050 can be controlled by adjusting the strength of the magnetic force. For example, the spacing is controlled by using the weight, buoyancy, and magnetic force of the semiconductor light-emitting diodes 1050. The spacing can be several millimeters to several tens of micrometers from the outermost part of the substrate 161.

Figure 8C:
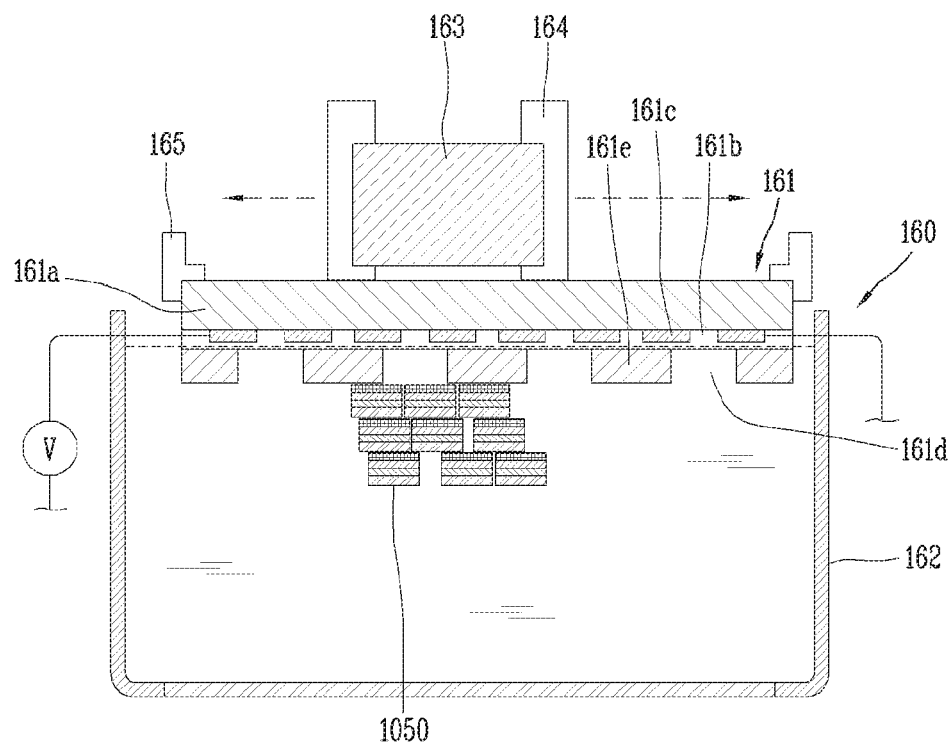

Next, a magnetic force is applied to the semiconductor light-emitting diodes 1050 so that the semiconductor light-emitting diodes 1050 move in one direction within the fluid chamber 162. For example, the magnets 163 can move in a horizontal, clockwise, or counterclockwise direction to the substrate 161 (FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Figure 8D:
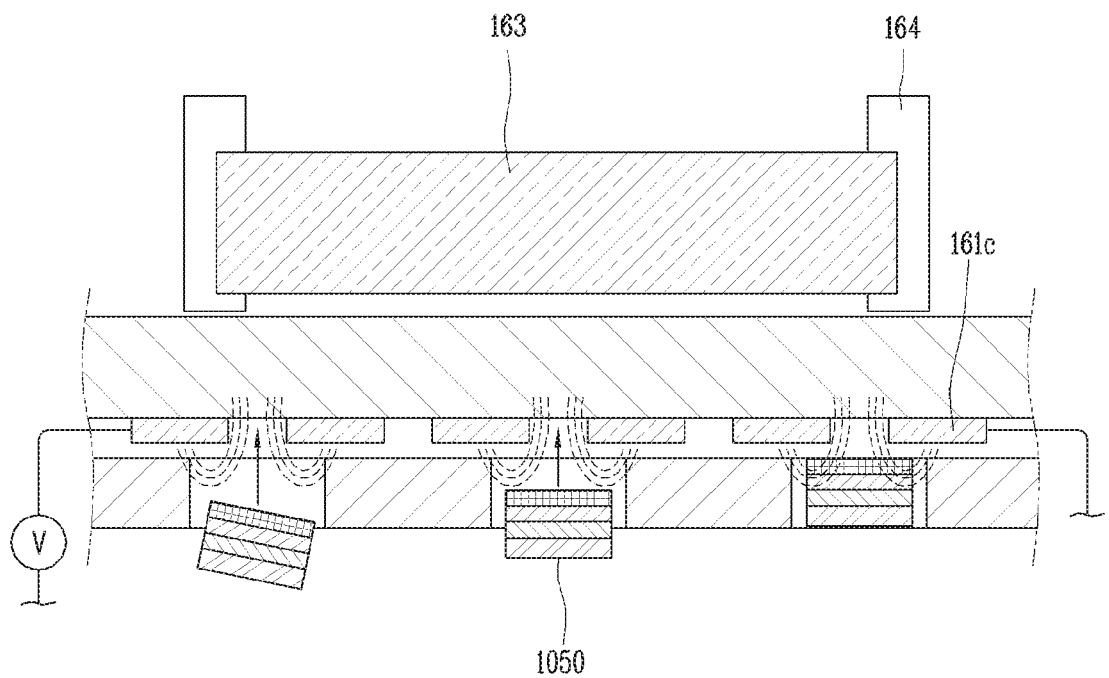
Figure 8E:
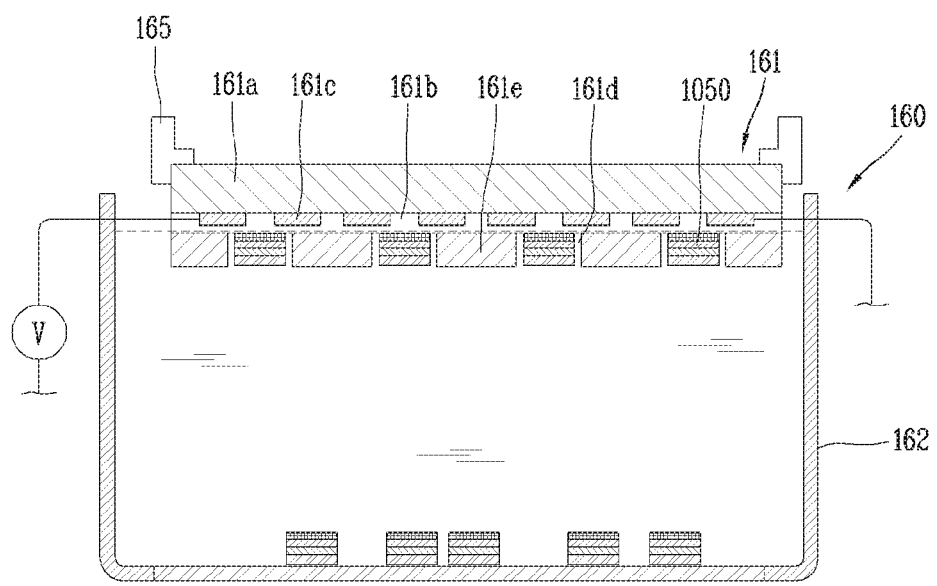

Meanwhile, after the semiconductor light-emitting diodes 1050 are guided to the preset positions, the magnets 163 can be moved in a direction in which they get farther away from the substrate 161, so that the semiconductor light-emitting diodes 1050 remaining in the fluid chamber 162 fall to the bottom of the fluid chamber 162 (FIG. 8D). In another example, if power supply is stopped in a case where the magnets 163 are electromagnets, the semiconductor light-emitting diodes 1050 remaining in the fluid chamber 162 fall to the bottom of the fluid chamber 162.

Thereafter, the semiconductor light-emitting diodes 1050 on the bottom of the fluid chamber 162 can be collected, and the collected semiconductor light-emitting diodes 1050 can be re-used.

In the above-explained self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects. That is, the assembly substrate is placed on the top to increase transfer yields, thus minimizing the effect of gravity or friction and avoiding non-specific binding.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

Meanwhile, as described with reference to FIGS. 8A to 8G, in the above-described self-assembling method, semiconductor light emitting diodes emitting different colors can be sequentially disposed on a substrate. In order to arrange semiconductor light emitting diodes emitting different colors on a single substrate, a self-assembly process should be performed as many as the number of types of the semiconductor light emitting diodes. For example, the self-assembly process should be performed at least three times to arrange semiconductor light emitting diodes of emitting blue, red, and green on a single substrate.

In this specification, an embodiment of assembling semiconductor light emitting diodes emitting three kinds of colors onto one substrate will be described. However, types of semiconductor light emitting diodes assembled to one assembly substrate are not limited thereto. Hereinafter, semiconductor light emitting diodes emitting light of different colors will be referred to as first to third semiconductor light emitting diodes, and the first to third semiconductor light emitting diodes are sequentially assembled on an assembly substrate.

An electrode to which a voltage is applied varies depending on a type of semiconductor light emitting diode introduced or inserted into the fluid chamber. Hereinafter, the above-mentioned electrode 161c is referred to as an assembly electrode. Specifically, a plurality of assembly electrodes 161c is divided into three groups. Hereinafter, the plurality of assembly electrodes is divided into first to third groups.

In the self-assembly, the first semiconductor light emitting diodes overlap any one of the assembly electrodes belonging to the first group. The second semiconductor light emitting diodes overlap any one of the assembly electrodes belonging to the second group. The third semiconductor light emitting diodes overlap any one of the assembly electrodes belonging to the third group.

When the self-assembly is performed while the first semiconductor light emitting diodes are introduced into the fluid chamber, a voltage must be applied to the assembly electrodes belonging to the first group. When the self-assembly is performed while the second semiconductor light emitting diodes are introduced into the fluid chamber, a voltage must be applied to the assembly electrodes belonging to the second group. Also, when the self-assembly is performed while the third semiconductor light emitting diodes are introduced into the fluid chamber, a voltage must be applied to the assembly electrodes belonging to the third group.

However, a voltage is not required to be applied only to assembly electrodes of a group corresponding to specific semiconductor light emitting diodes in a state in which the specific semiconductor light emitting diodes are introduced in the fluid chamber. Specifically, when the self-assembly is performed while the second semiconductor light emitting diodes are introduced in the fluid chamber, the first semiconductor light emitting diodes have already been bonded to the substrate. In this instance, when a voltage applied to the assembly electrodes belonging to the first group is blocked, the first semiconductor light emitting diodes can be separated from the substrate. In order to prevent this, when the self-assembly is performed while the second semiconductor light emitting diodes are introduced, a voltage must be applied to both the first and second groups. In this instance, attractive force can act between the assembly electrodes belonging to the first group and the second semiconductor light emitting diodes. However, since the first semiconductor light emitting diodes are already aligned at designated positions, the second semiconductor light emitting diodes are not aligned to overlap the assembly electrodes belonging to the first group.

On the other hand, when the third semiconductor light emitting diodes are self-assembled, a voltage must be applied to all of the first to third groups in the state in which the third semiconductor light emitting diodes are introduced in the fluid chamber.

However, in the above-described self-assembly method, when a semiconductor light emitting diode is not seated (mounted, placed, aligned) at a preset position during self-assembly, a problem arises in that an unwanted semiconductor light emitting diode is seated at the preset position in a subsequent self-assembly process.

For example, when the first semiconductor light emitting diodes are completely self-assembled, the first semiconductor light emitting diodes may not be mounted in some grooves overlapping with the assembly electrodes belonging to the first group. In this state, when the self-assembly for the second semiconductor light emitting diodes is performed, the second semiconductor light emitting diodes can be mounted on positions where the first semiconductor light emitting diodes should be placed. This is because a voltage is applied to the assembly electrodes belonging to the first group even during the self-assembly for the second semiconductor light emitting diodes. In order to prevent separation of the pre-assembled first semiconductor light emitting diodes, it is inevitable to apply a voltage to the assembly electrodes belonging to the first group even during the self-assembly for the second semiconductor light emitting diodes. However, this causes a problem in that the semiconductor light emitting diodes are incorrectly assembled.

The present disclosure provides a structure and method for blocking a voltage applied to an assembly electrode, which has formed an electric field during a preceding self-assembly, when a subsequent self-assembly is performed after the completion of the preceding self-assembly.

Hereinafter, a self-assembly method according to the present disclosure will be described.

First, a step of forming through surface treatment predetermined functional groups on surfaces of a plurality of semiconductor light emitting diodes each having a magnetic material is performed.

Specifically, functional groups are formed on the surfaces of the semiconductor light emitting diodes in a state in which the semiconductor light emitting diodes are separated from a growth substrate. Hydrophilic functional groups can be formed on the surfaces of the semiconductor light emitting diodes. For example, at least one of a hydroxyl group and an amine group can be formed on the surfaces of the semiconductor light emitting diodes. However, the present disclosure is not limited thereto, and the functional group can be any functional group capable of forming a covalent bond through a condensation reaction.

Figure 10:
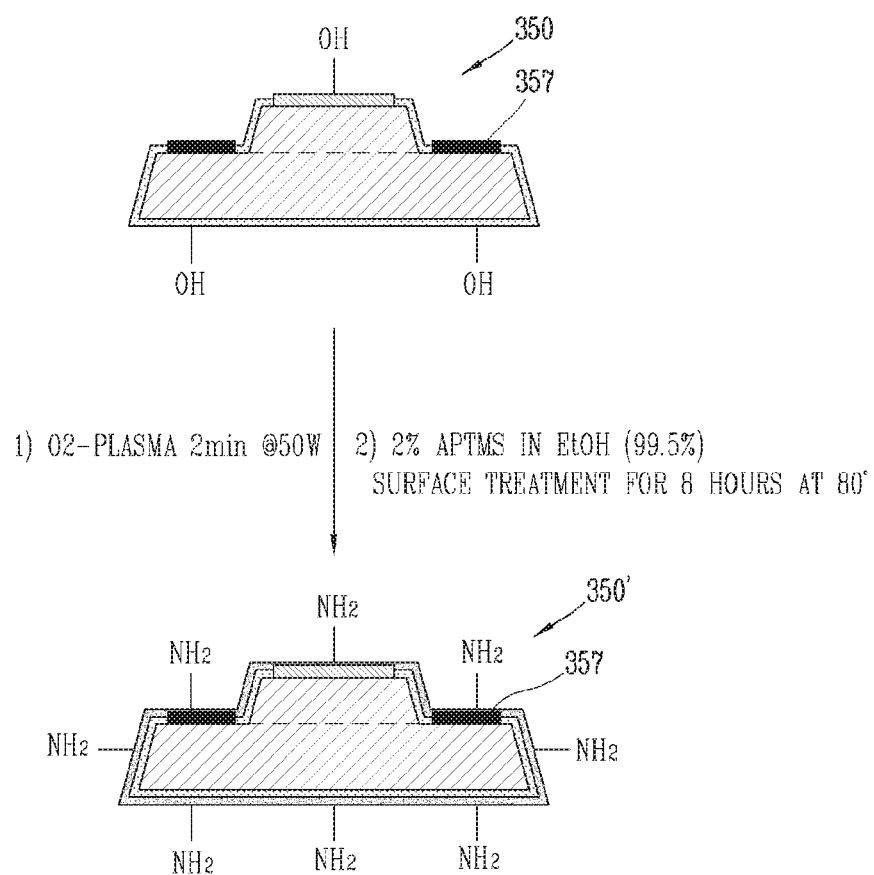
FIG. 10 is a conceptual diagram illustrating a surface treatment method for a semiconductor light emitting diode.

In one embodiment, referring to FIG. 10, when the semiconductor light emitting diodes 350 (or 350") are subjected to O2-plasma treatment (e.g., 50 W) for about 2 minutes, for example, and followed by surface treatment for 8 hours in a 80° C. solution that 2% of aminopropyl trimethoxysilane (APTMS) is dissolved in EtOH (99.5%), an amine group is formed on the surfaces of the semiconductor light emitting diodes 350'.

Here, the structure of APTMS is shown in the following chemical formula (1).

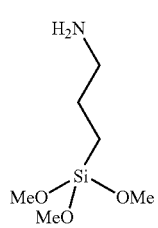

[Chemical Formula 1]

On the other hand, a compound for the surface treatment of the semiconductor light emitting diodes is not limited to APTMS. In another embodiment, the surfaces of the semiconductor light emitting diodes can be treated with a compound (glycidoxypropyl trimethoxysilane (GPTMS)) according to the following chemical formula (2).

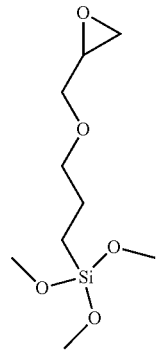

[Chemical Formula 2]

In another embodiment, when the O2-plasma treatment (e.g., 50 W) is performed on the semiconductor light emitting diodes for about 2 minutes, a large amount of hydroxyl groups is produced on the surfaces of the semiconductor light emitting diodes.

The functional group formed on the surfaces of the semiconductor light emitting diodes 350 is utilized to form a covalent bond with a compound to be described later to generate a covalent bond layer 357.

Next, a step of bonding a predetermined compound to a surface of a substrate having a plurality of assembly electrodes is carried out. The substrate can be further provided with a dielectric layer covering the assembly electrodes, and partition walls, in addition to the assembly electrodes. The predetermined compound is not bonded to the surfaces of the assembly electrodes, but to surfaces of the partition walls and a surface of the dielectric layer surface exposed to outside.

Figure 11:
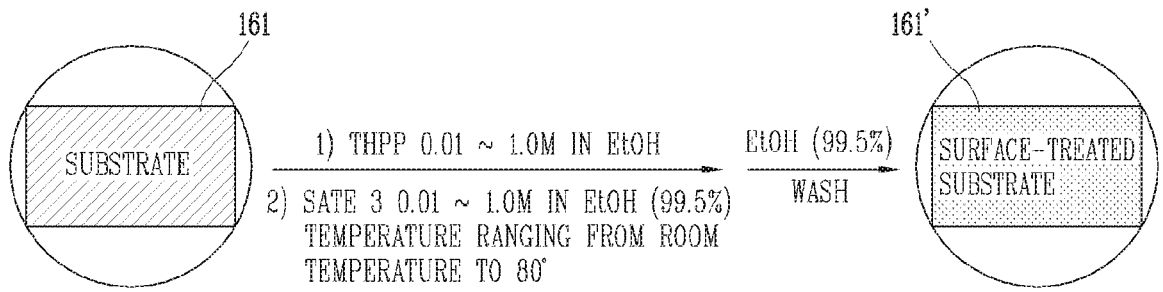
FIG. 11 is a conceptual diagram illustrating a surface treatment method applied to a substrate.

In one embodiment, referring to FIG. 11, the substrate 161 is immersed or submerged in a solution that 0.01 to 1.0 M of THPP (see Chemical Formula 3 below) is dissolved in EtOH (99.5%), and then in a solution that 0.01 to 1.0 M of SATES (see Chemical Formula 4 below) is dissolved in EtOH (99.5%). Thereafter, the substrate is exposed to a temperature ranging from room temperature to 80° C. for 16 hours and then washed with EtOH (99.5%). In this case, the hydroxyl group formed on the surface of the substrate reacts with a silane group contained in THPP, and the hydroxyl group formed on the terminal of THPP reacts with a silane group contained in SATES. A Si—O bond is formed between the substrate 161' and the compound.

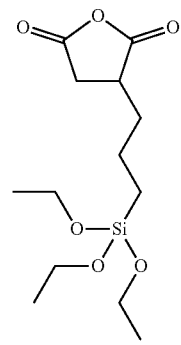

[Chemical Formula 3]

-continued

[Chemical Formula 4]

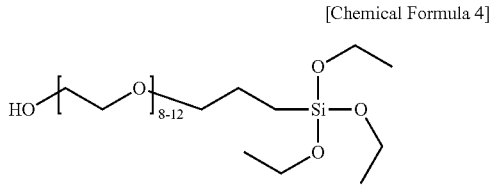

In another embodiment, the substrate is submerged in a solution that 0.01~1.0M of SATES is dissolved in EtOH (99.5%). Thereafter, the substrate is exposed to a temperature ranging from room temperature to 80° C. for 16 hours and then washed with EtOH (99.5%). In this instance, the hydroxyl group formed on the surface of the substrate reacts with the silane group contained in SATES. A Si—O bond is formed between the substrate and the compound.

However, the compound is not limited to SATES and THPP, and can be a compound that contains a silane group capable of forming a Si—O bond with a substrate and a functional group capable of forming a covalent bond with functional groups formed in the semiconductor light emitting diode through heat treatment to be described later. For example, the compound can be a compound containing a succinic anhydride group and a silane group.

Functional groups contained in the predetermined compound bonded to the surface of the substrate are used to form covalent bonds with the semiconductor light emitting diodes. Although the structure of the predetermined compound partially changes according to the reaction between the compound and the functional groups formed on the surface of the substrate, such compound is referred to as a predetermined compound in a state bonded to the surface of the substrate or the predetermined compound.

Thereafter, the self-assembly step described with reference to FIGS. 8A to 8G is performed. Thereafter, heat treatment for the substrate is carried out such that a covalent bond is formed through a reaction between the predetermined functional groups and the predetermined compound bonded to the surface of the substrate. A reaction between the succinic anhydride group contained in the predetermined compound and the predetermined functional group can occur.

Figure 12:
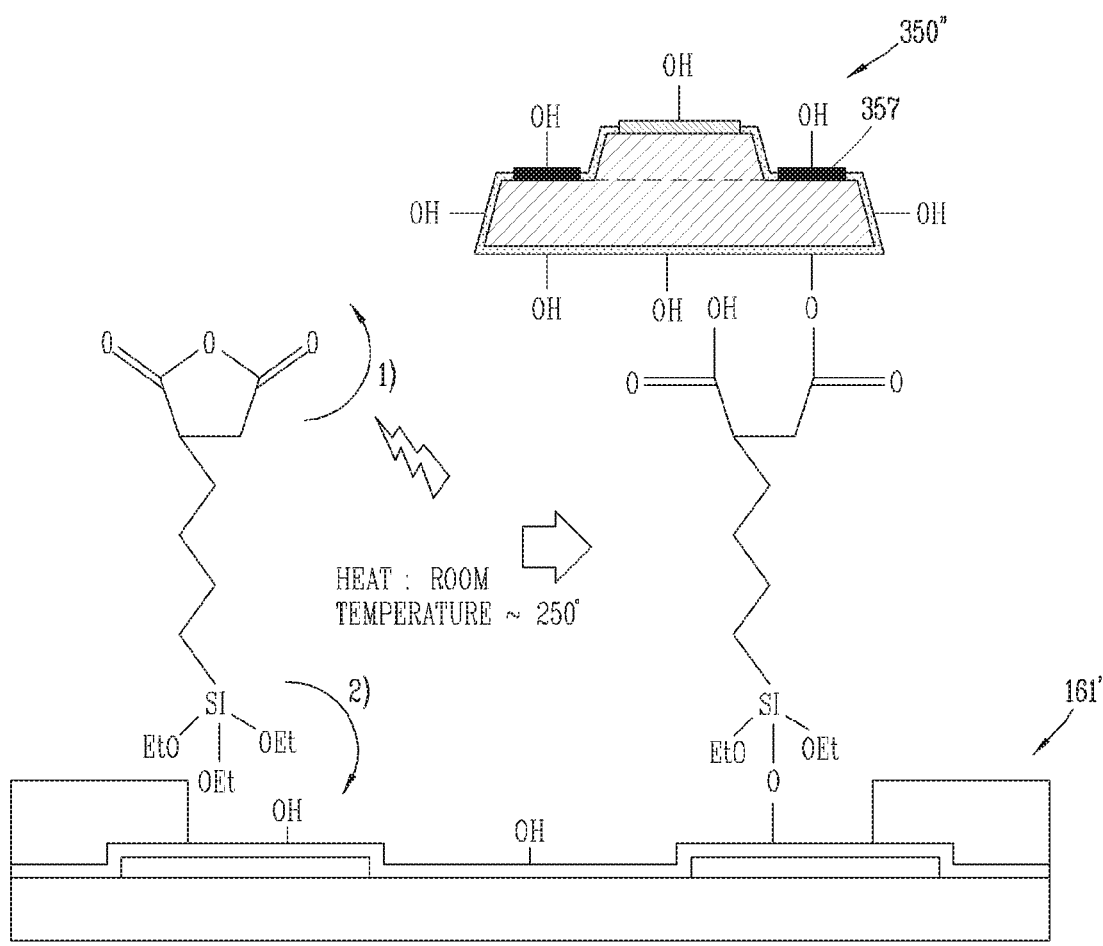
FIGS. 12 and 13 are conceptual diagrams illustrating formation of a covalent bond layer through an ester reaction.
Figure 13:
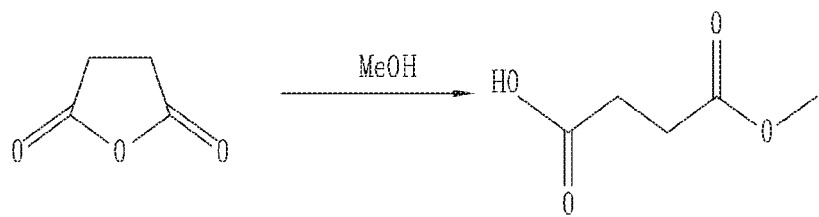

As illustrated in FIG. 12, when the predetermined functional group is a hydroxyl group, an ester bond is formed by the heat treatment. The succinic anhydride group formed in the predetermined compound and the hydroxyl group form an ester bond through a chemical reaction as illustrated in FIG. 13.

Figure 14:
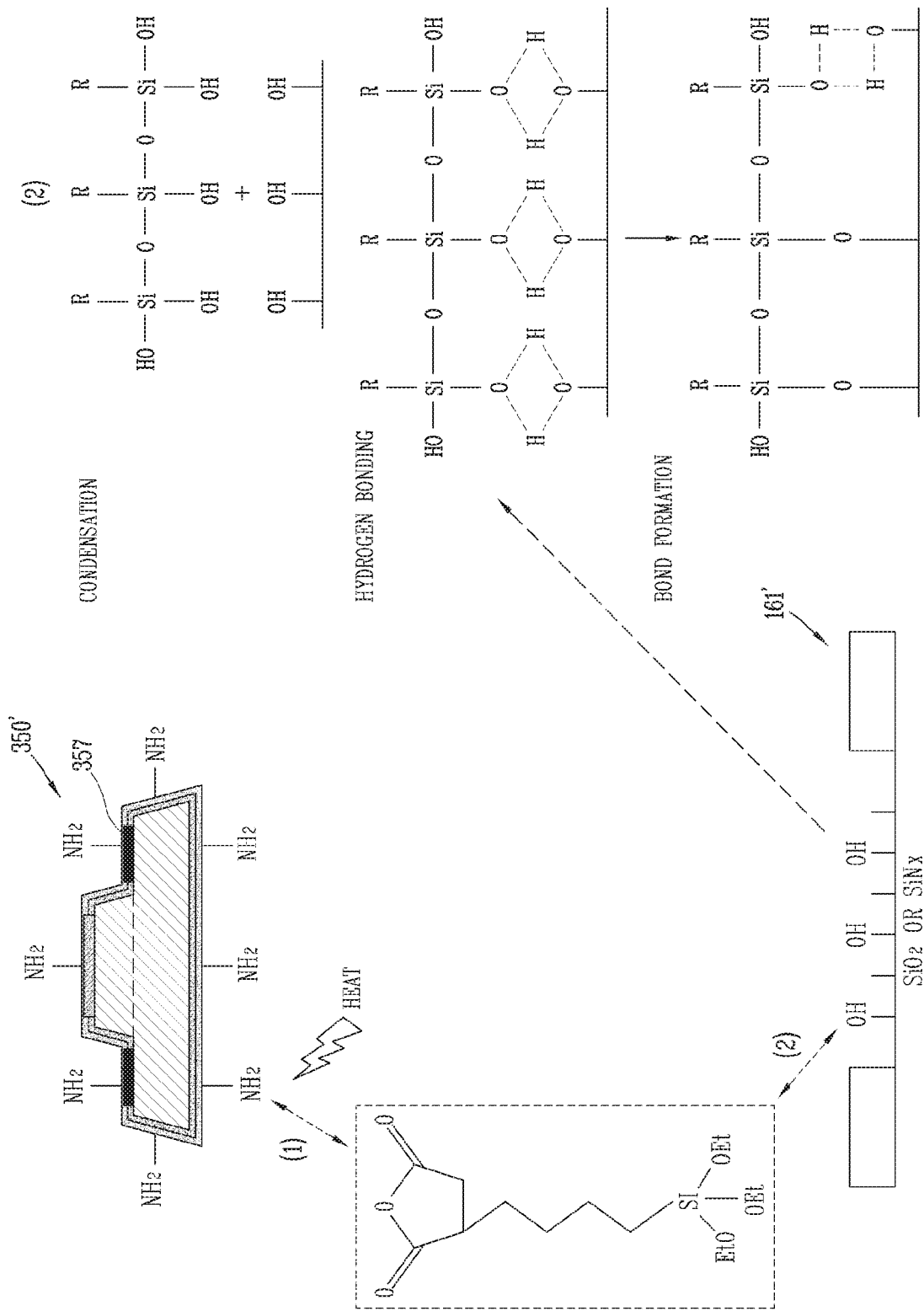
FIGS. 14 and 15 are conceptual diagrams illustrating formation of a covalent bond layer through an amide reaction.
Figure 15:
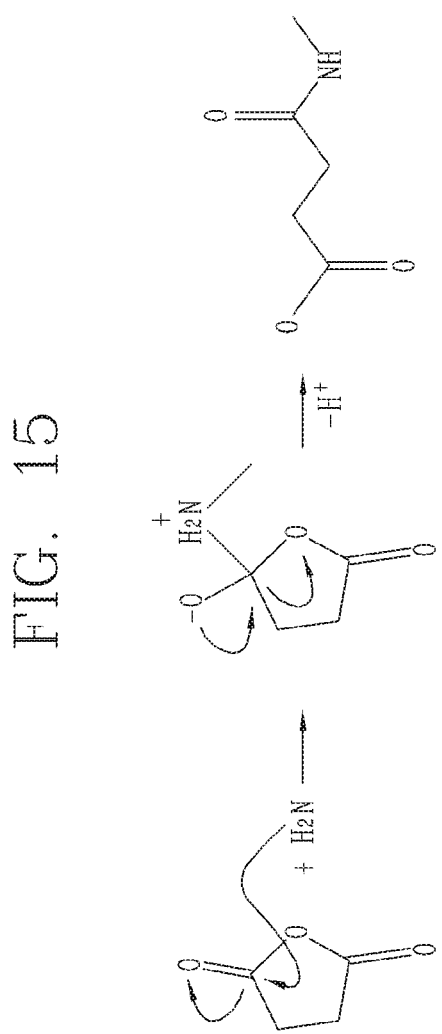

On the other hand, as illustrated in FIG. 14, when the predetermined functional group is an amine group, an amide bond is formed by the heat treatment. The succinic anhydride group formed in the predetermined compound and the amine group form an amide bond through a chemical reaction as illustrated in FIG. 15.

A temperature of the heat treatment can vary depending on a type of the predetermined functional group and a type of the predetermined compound, but preferably does not exceed 250° C. When the heat treatment is performed at a temperature exceeding 250° C., the semiconductor light emitting diodes can be damaged.

As a result of the heat treatment described above, a covalent bond layer forming a covalent bond with the dielectric layer and each of the semiconductor light emitting diodes is formed. The covalent bond layer strongly bonds the semiconductor light emitting diodes to the dielectric layer, thereby preventing the semiconductor light emitting diodes from being separated from the substrate even when a voltage applied to the assembly electrodes is cut off after the self-assembly.

The use of the above-described covalent bond layer can result in preventing different types of semiconductor light emitting diodes from being incorrectly assembled when sequentially self-assembling the different types of semiconductor light emitting diodes. Hereinafter, utilizing the covalent bond layer when sequentially self-assembling different types of semiconductor light emitting diodes will be described.

When sequentially self-assembling different types of semiconductor light emitting diodes, a step of applying magnetic force to the semiconductor light emitting diodes and a step of inducing or guiding the semiconductor light emitting diodes to preset positions should be performed more times than the number of types of semiconductor light emitting diodes to be assembled.

For example, in the case of sequentially assembling the first to third semiconductor light emitting diodes, each of the step of applying the magnetic force to the semiconductor light emitting diodes and the step of inducing the semiconductor light emitting diodes to the preset positions should be performed at least once in the state in which the first semiconductor light emitting diodes are introduced in the fluid chamber, at least once in the state in which the second semiconductor light emitting diodes are introduced in the fluid chamber, and at least once in the state in which the third semiconductor light emitting diodes are introduced in the fluid chamber.

At this time, the assembly electrodes to which a voltage should be applied vary depending on the type of semiconductor light emitting diode introduced in the fluid chamber.

Specifically, inducing the first semiconductor light emitting diodes to the preset positions should be performed by applying a voltage to some (assembly electrodes belonging to the first group) of the plurality of assembly electrodes such that the first semiconductor light emitting diodes are induced to a first position, inducing the second semiconductor light emitting diodes to the preset position should be performed by applying a voltage to some (assembly electrodes belonging to the second group) of the plurality of assembly electrodes such that the second semiconductor light emitting diodes are induced to a preset second position, and inducing the third semiconductor light emitting diodes to the preset position should be performed by applying a voltage to some (assembly electrodes belonging to the third group) of the plurality of assembly electrodes such that the third semiconductor light emitting diodes are induced to a preset third position.

Here, the heat treatment of the substrate is performed until the self-assembly for any one type of semiconductor light emitting diodes is completed.

Specifically, the heat treatment of the substrate should be performed at least once in the state where the first semiconductor light emitting diodes are seated at the preset first position, at least once in the state where the second semiconductor light emitting diodes are seated at the preset second position, and at least once in the state where the third semiconductor light emitting diodes are seated at the preset third position.

The heat treatment performed after the completion of the last self-assembly is not essential, but is preferably performed even after the last self-assembly in order to prevent the semiconductor light emitting diodes from being separated from the substrate during a subsequent process.

On the other hand, when self-assembly of another type of semiconductor light emitting diodes is performed after completely self-assembling one type of semiconductor light emitting diodes, a voltage applied to the assembly electrodes corresponding to the one type of semiconductor light emitting diodes should be blocked.

For example, when the second semiconductor light emitting diodes are induced to the preset second position after the first semiconductor light emitting diodes are seated at the preset first position, a step of blocking a voltage applied to a part (assembly electrodes belonging to the first group) of the plurality of assembly electrodes can be performed. This voltage blocking must be performed before the self-assembly with respect to the second semiconductor light emitting diodes is performed.

In another example, when the third semiconductor light emitting diodes are induced to the preset third position after the first and second semiconductor light emitting diodes are seated at the preset first and second positions, a step of blocking a voltage applied to another part (assembly electrodes belonging to the second group) of the plurality of assembly electrodes can be performed. At this time, the voltage applied to the assembly electrodes belonging to the first group should be in a blocked state (i.e., should be blocked when self-assembling the second semiconductor light emitting diodes).

Accordingly, when semiconductor light emitting diodes of another type are self-assembled after semiconductor light emitting diodes of one type are self-assembled, the semiconductor light emitting diodes of the one type cannot be separated from the substrate by virtue of the covalent bond layer, even if the voltage applied to the assembly electrodes corresponding to the semiconductor light emitting diodes of the one type is blocked.

Table 1 below shows effects of the above-described heat treatment. Specifically, after performing the above heat treatment step, the substrate was kept in water for 1 hour while blocking the voltage applied to the assembly electrodes. Thereafter, the number of semiconductor light emitting diodes left on the substrate was calculated.

TABLE 1

| SATES concentration (M) | | Reference: No surface treatment | 0.01 | 0.05 | 0.10 | 1.00 | 1.00 |
|---|---|---|---|---|---|---|---|
| THPP concentration (M) | | | — | — | | | 0.50 |
| Fixing maintenance rate (%): Result after one-time immersion in water | | <10 | 59.6 | 85.8 | 94.2 | 97.8 | 99.5* |
| Remarks | Dielectric layer material | SiNx | SiNx | $SiO_2$ | $SiO_2$ | $SiO_2$ | SiNx |
| | Area | 6-inch assembly substrate (22500 sites) | | | | | |
| | Surface treatment temperature | — | Room temperature | | 40° | | |

Referring to Table 1, it can be seen that a fixed rate of the semiconductor light emitting diodes is equal to or higher than 99% when heat treatment is performed by using both STATES and THPP. Accordingly, when semiconductor light emitting diodes of another type are self-assembled after semiconductor light emitting diodes of one type are completely self-assembled, a voltage applied to the assembly electrodes corresponding to the semiconductor light emitting diodes of the one type can be blocked by use of the covalent bod layer.

As described above, the present disclosure can prevent another type of semiconductor light emitting diodes from being seated at a position where one type of semiconductor light emitting diodes should be seated, in the case where different types of semiconductor light emitting diodes are sequentially self-assembled.

What is claimed is:

1. A display device, comprising:
a plurality of semiconductor light emitting diodes;
first and second wiring electrodes respectively extending from the plurality of semiconductor light emitting diodes to supply an electrical signal to the plurality of semiconductor light emitting diodes;
a plurality of pair electrodes disposed on a substrate and having a first electrode and a second electrode that generate an electric field when a current is supplied thereto;
a dielectric layer disposed to cover the plurality of pair electrodes; and
a covalent bond layer disposed between the dielectric layer and the plurality of semiconductor light emitting diodes, and forming a covalent bond with the dielectric layer and each of the plurality of semiconductor light emitting diodes,
wherein the first wiring electrode and the second wiring electrode are located at opposite sides of the plurality of pair electrodes based on the plurality of semiconductor light emitting diodes, and
wherein the covalent bond layer bonds the plurality of semiconductor light emitting diodes to the dielectric layer when a voltage applied to the plurality of pair electrodes for generating the electric field is cut off after the plurality of semiconductor light emitting diodes are assembled on the dielectric layer.

2. The display device of claim 1, wherein an Si—O bond is formed between the dielectric layer and the covalent bond layer,
wherein one of the plurality of semiconductor light emitting diodes comprises a first conductive semiconductor layer, a second conductive semiconductor layer and an active layer placed between the first and second conductive semiconductor layers, and
wherein the covalent bond layer is disposed between only the first conductive semiconductor layer and the dielectric layer.

3. The display device of claim 2, wherein any one of an ester bond and an amide bond is formed between the plurality of semiconductor light emitting diodes and the covalent bond layer.

4. The display device of claim 1, wherein the covalent bond layer is a reaction product between a functional group formed on a surface of the substrate and a surface of each of the plurality of semiconductor light emitting diodes, and a compound according to the following chemical formula 3, or
a reaction product between the functional group formed on the surface of the substrate and the surface of each of the plurality of semiconductor light emitting diodes, and a mixture of the compound according to the following chemical formula 3 and a compound according to the following chemical formula 4,

[Chemical Formula 3]

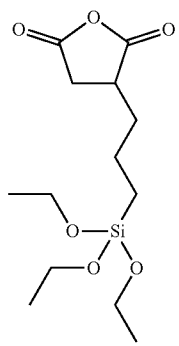

[Chemical Formula 4]

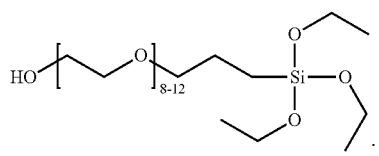

5. A display device, comprising:
a plurality of semiconductor light emitting diodes on a substrate;
a plurality of pair electrodes disposed on the substrate and having a first electrode and a second electrode that generate an electric field when a current is supplied thereto;
a dielectric layer disposed to cover the plurality of pair electrodes; and
a covalent bond layer disposed between the dielectric layer and the plurality of semiconductor light emitting diodes, and forming a covalent bond with the dielectric layer and each of the plurality of semiconductor light emitting diodes,
wherein the covalent bond layer bonds the plurality of semiconductor light emitting diodes to the dielectric layer when a voltage applied to the plurality of pair electrodes for generating the electric field is cut off after the plurality of semiconductor light emitting diodes are assembled on the dielectric layer.

6. The display device of claim 5, further comprising first and second wiring electrodes respectively extending from the plurality of semiconductor light emitting diodes to supply an electrical signal to the plurality of semiconductor light emitting diodes,
wherein the first wiring electrode and the second wiring electrode are located at opposite sides of the plurality of pair electrodes based on the plurality of semiconductor light emitting diodes.

7. The display device of claim 5, wherein an Si—O bond is formed between the dielectric layer and the covalent bond layer,
wherein one of the plurality of semiconductor light emitting diodes comprises a first conductive semiconductor layer, a second conductive semiconductor layer and an active layer placed between the first and second conductive semiconductor layers, and wherein the covalent bond layer is disposed between only the first conductive semiconductor layer and the dielectric layer.

8. The display device of claim 7, wherein any one of an ester bond and an amide bond is formed between the plurality of semiconductor light emitting diodes and the covalent bond layer.

9. The display device of claim 5, wherein the covalent bond layer is a reaction product between a functional group formed on a surface of the substrate and a surface of each of the plurality of semiconductor light emitting diodes, and a compound according to the following chemical formula 3, or
a reaction product between the functional group formed on the surface of the substrate and the surface of each of the plurality of semiconductor light emitting diodes, and a mixture of the compound according to the following chemical formula 3 and a compound according to the following chemical formula 4,

[Chemical Formula 3]

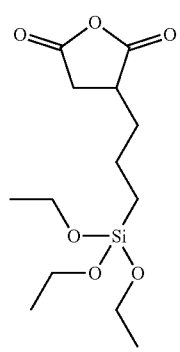

[Chemical Formula 4]

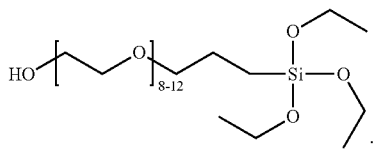

10. The display device of claim 5, wherein the covalent bond layer is a reaction product between a functional group formed on a surface of the substrate and a surface of each of the plurality of semiconductor light emitting diodes, and a compound containing a silane group capable of forming a Si—O bond with the substrate and the functional group capable of forming a covalent bond with functional groups formed on the plurality of semiconductor light emitting diode through heat treatment.

11. The display device of claim 10, wherein the compound contains a succinic anhydride group.

12. The display device of claim 11, wherein, when the functional groups formed on the plurality of semiconductor light emitting diode is a hydroxyl group, an ester bond is formed by the heat treatment.

13. The display device of claim 12, wherein the succinic anhydride group and the hydroxyl group form the ester bond through a chemical reaction.

14. The display device of claim 11, wherein, when the functional groups formed on the plurality of semiconductor light emitting diode is an amine group, an amide bond is formed by the heat treatment.

15. A display device, comprising:

a substrate;

a plurality of pair electrodes disposed on the substrate and having a first electrode and a second electrode;

a plurality of semiconductor light emitting diodes on the plurality of pair electrodes; and a covalent bond layer disposed between the substrate and the plurality of semiconductor light emitting diodes, wherein the covalent bond layer bonds the plurality of semiconductor light emitting diodes to the substrate when a voltage applied to the plurality of pair electrodes for generating the electric field is cut off after the plurality of semiconductor light emitting diodes are assembled on the substrate.

16. The display device of claim 15, further comprising a dielectric layer on the plurality of pair electrodes, wherein the covalent bond layer is disposed between the dielectric layer and the plurality of semiconductor light emitting diodes.

17. The display device of claim 16, wherein an Si—O bond is formed between the dielectric layer and the covalent bond layer, wherein one of the plurality of semiconductor light emitting diodes comprises a first conductive semiconductor layer, a second conductive semiconductor layer and an active layer placed between the first and second conductive semiconductor layers, and wherein the covalent bond layer is disposed between only the first conductive semiconductor layer and the dielectric layer.

18. The display device of claim 16, wherein any one of an ester bond and an amide bond is formed between the plurality of semiconductor light emitting diodes and the covalent bond layer.

19. The display device of claim 15, wherein the covalent bond layer is a reaction product between a functional group formed on a surface of the substrate and a surface of each of the plurality of semiconductor light emitting diodes, and a compound according to the following chemical formula 3,

[Chemical Formula 3]

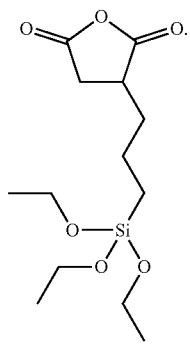

20. The display device of claim 15, wherein the covalent bond layer is a reaction product between a functional group formed on a surface of the substrate and a surface of each of the plurality of semiconductor light emitting diodes, and a mixture of a compound according to the following chemical formula 3 and a compound according to the following chemical formula 4,

[Chemical Formula 3]

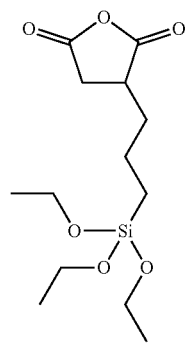

[Chemical Formula 4]

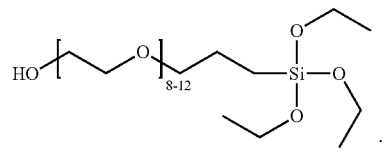

* * * * *